United States Patent [19]

Schmelzer et al.

[11] Patent Number: 5,759,422
[45] Date of Patent: Jun. 2, 1998

[54] PATTERNED METAL FOIL LAMINATE AND METHOD FOR MAKING SAME

[75] Inventors: Michael A. Schmelzer, Appleton; Anthony Joseph Swiontek, Neenah, both of Wis.; Charles C. Habeger, Milford; Kenneth A. Pollart, Mason, both of Ohio

[73] Assignee: Fort James Corporation, Milford, Ohio

[21] Appl. No.: 602,576

[22] Filed: Feb. 14, 1996

[51] Int. Cl.$^6$ .................................................. B44C 1/22
[52] U.S. Cl. .............................. 216/35; 216/65; 156/250; 156/272.8; 426/107; 426/241
[58] Field of Search .............................. 216/33, 35, 41, 216/52, 65, 102; 426/107, 113, 122, 241; 156/224, 291, 290, 250, 251, 272.8

[56] References Cited

U.S. PATENT DOCUMENTS

| Re. 34,683 | 8/1994 | Maynard et al. |
|---|---|---|
| 3,615,713 | 10/1971 | Stevenson |
| 3,936,626 | 2/1976 | Moore |
| 4,230,924 | 10/1980 | Brastad et al. |
| 4,351,997 | 9/1982 | Mattisson et al. |
| 4,552,614 | 11/1985 | Beckett |
| 4,685,997 | 8/1987 | Beckett ............... 216/102 X |
| 4,959,120 | 9/1990 | Wilson ............... 156/651.1 |
| 5,340,436 | 8/1994 | Beckett |
| 5,370,883 | 12/1994 | Saunier |

FOREIGN PATENT DOCUMENTS 0206811 12/1986 European Pat. Off.

*Primary Examiner*—William Powell
*Attorney, Agent, or Firm*—Sixbey, Friedman, Leedom & Ferguson, PC; Charles M. Leedom, Jr.; Donald R. Studebaker

[57] ABSTRACT

A patterned metal foil/substrate laminate wherein the pattern is formed by laminating a sheet of metal foil to a substrate by applying an adhesive between the metal foil and substrate in a predetermined pattern which defines areas where adhesive is present and areas where no adhesive is present, cutting the metal foil, as by rotary die cutting or laser cutting, in a pattern which corresponds to the boundaries of the adhesive-containing areas and removing the areas of metal foil which are not adhesively adhered to the substrate. Particularly where the laminate is intended for microwave packaging, the laminate further includes a sheet of barrier layer material, preferably polymer film, laminated to the patterned metal foil layer. The polymer film layer-containing laminate can be formed into a container for packaging food intended for heating in a microwave oven, the container having at least one section, corresponding to the areas of the laminate from which metal foil was removed, that is substantially transparent to microwave energy and at least one section, corresponding to the foil-containing areas of the laminate, that is opaque to microwave energy for shielding food adjacent to the opaque section. Preferably, the metal foil is aluminum foil, desirably unannealed aluminum foil, and the substrate is selected from paper, coated or uncoated paperboard and polymer film.

46 Claims, 3 Drawing Sheets

FIG.1
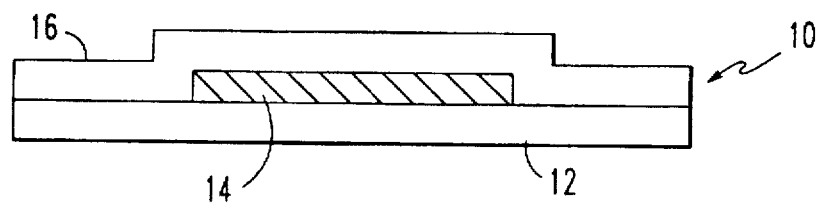
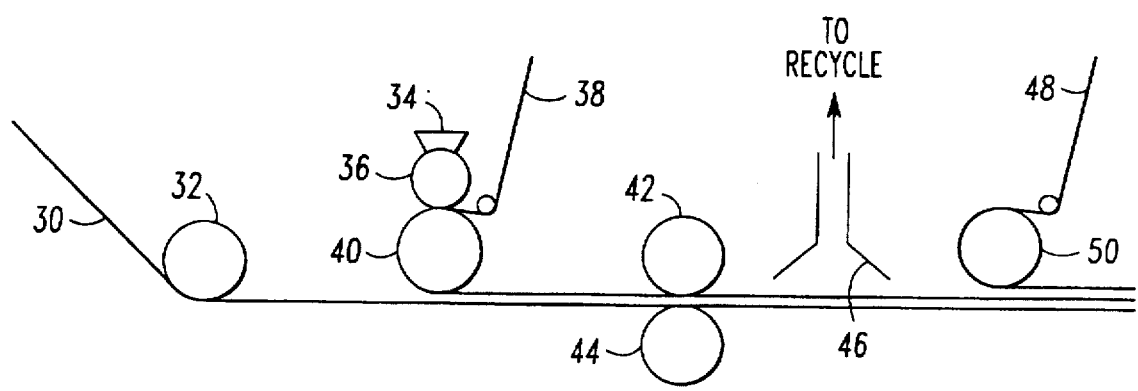
FIG.2

5,759,422

1

PATTERNED METAL FOIL LAMINATE AND METHOD FOR MAKING SAME

BACKGROUND OF THE INVENTION

1. Field of the Invention

The present invention relates generally to metal foil-containing laminates and to methods of making such laminates, more specifically to metal foil/substrate laminates useful for forming into food containers especially suitable for packaging foods intended to be heated in a microwave oven and, more particularly, to patterned metal foil/substrate laminates.

2. Description of the Prior Art

The increasing popularity of microwave ovens for cooking all or a part of a meal has led to the development of a large variety of food products capable of being cooked in a microwave oven directly in the food packaging in which they are stored. The convenience of being able to cook food without removing it from the package appeals to a great many consumers. Unfortunately, however, currently available packaging for microwavable food products suffers from some significant disadvantages. A major disadvantage is the inability of the packaging to control the amount of microwave energy received by different areas of the food contained within the packaging. One particular problem is that the edges as well as the thinner areas of a food item become dried out and overcooked while the central or thicker areas may be barely cooked at all. Frozen food products, particularly relatively large volume items and, more particularly, food items which have a thick center section and thinner end sections, are illustrative of food products which are likely to cook unevenly in available freezer-to-microwave oven packaging. Likewise, frozen food products which consist of multiple different foodstuffs, each of which require different degrees of microwave heating, are food products in which some of the foodstuffs are likely to be overcooked while others are likely to be undercooked in available freezer-to-microwave packaging.

Metal foil, such as aluminum foil, in contrast to thin metallized coatings, reflects rather than transmits or absorbs microwave energy. Thus, instead of being partially or completely transparent to microwave energy, metal foil is opaque. This characteristic of metal foils and their use for microwave shielding has long been known and utilized in microwave food packaging. For example, U.S. Pat. No. 3,615,713 and U.S. Pat. No. 3,936,626 disclose microwave cooking apparatus comprising a tray having multiple and differently sized cutouts and a plurality of individual containers which are sized to be supported in the cutouts in the tray. Each container is designed to fully and properly cook the food product contained therewithin simultaneously with the food products in the other containers in order that a complete meal can be simultaneously prepared. The containers include varying amounts of aluminum foil for controlling the amount of microwave energy reaching each of the food products. For example, containers which are intended to contain food products which require little or no heating, such as ice cream, are formed of aluminum foil to fully shield the contents from microwave energy. Other containers are likewise formed of a microwave opaque material, such as aluminum foil, but have holes or openings formed therein to allow selected amounts of microwave radiation to penetrate the container and cook the food product therewithin within the prescribed time. The number and size of the holes is determined according to the normal cooking requirements of the food product within the container.

2

U.S. Pat. No. 4,351,997 discloses a food package comprising a tray including a bottom wall transparent to microwave radiation and a peripheral structure, including a peripheral wall and a peripheral rim extending outwardly from the peripheral wall at its top, wherein at least a portion of the peripheral structure incorporates a microwave opaque material, such as metallic foil, e.g., aluminum foil. The foil may advantageously be coated onto the peripheral wall substrate or laminated thereto. Food packages in which the metal foil is selectively located or patterned to shield selected portions of the tray from microwave energy contribute to uniform microwave cooking of the food product within the packages. The same beneficial result is achieved in U.S. Pat. No. 5,370,883 in which a microwave heating tray is disclosed including a cover having portions thereof formed of an aluminum foil laminate for shielding selected portions of the tray.

Metal foil which has been patterned by selectively removing predetermined areas thereof is currently made for microwave packaging applications by caustic demetallizing of the metal foil in the predetermined areas. For example, according to the methods disclosed in U.S. Pat. Nos. 4,552,614 and 5,340,436, polyester film is vacuum metallized or laminated to aluminum foil and then selectively printed or coated with a patterned mask of caustic-resistant material over the areas of the aluminum foil to be protected. Thereafter, the masked laminate is sprayed with caustic or passed through a caustic bath wherein the unmasked areas of the aluminum foil are selectively removed by chemical reaction with the caustic. The resulting patterned foil/film laminate may be further laminated to a paper or paperboard substrate in conventional manner. However, the demetallizing process is slow, cumbersome and uneconomically costly. Equally important is that the chemical reaction generates hydrogen, which is difficult to deal with, and creates the need for aluminum recovery from the caustic bath.

Other methods for producing patterned metal foil for microwave packaging applications which have been proposed are likewise unsatisfactory for reasons peculiar to the proposed methods or because they are economically unattractive. Efforts up to this time, therefore, have failed to provide a commercially practical and economically attractive method for making a patterned metal foil laminate which, among other uses, is a particularly effective food packaging material for the selective microwave heating of a wide variety of food products.

SUMMARY OF THE INVENTION

It is therefore a primary object of the present invention to provide a method for making a patterned metal foil laminate which is especially useful as a microwave packaging for foods and which is commercially practical and economically attractive.

It is another object of the present invention to provide such a method that permits the forming of a wide variety of regular or irregular shaped patterns for selectively controlling the amount of microwave energy passing through the laminate and received by different foods or different areas of a food product within microwave packaging formed from the laminate.

It is still another object of the present invention to provide a method for making a patterned metal foil/substrate laminate wherein an adhesive is applied between the metal foil and the substrate in a predetermined pattern corresponding to the desired metal foil pattern in the laminate.

It is yet another object of the present invention to provide a method for making a patterned metal foil/substrate laminate wherein an adhesive is applied between the metal foil and the substrate in selected areas in a predetermined pattern, the metal foil is cut in a pattern that corresponds to the boundaries of the adhesive-applied areas and the unadhered areas of metal foil are removed to provide a laminate wherein the metal foil pattern corresponds to the adhesive application pattern.

It is yet another object of the present invention to provide a method for making a patterned metal foil/substrate laminate wherein an adhesive is applied between the metal foil and the substrate in selected areas in a predetermined pattern and the metal foil is cut with a rotary die, without unacceptably cutting or degrading the substrate, in a pattern that corresponds to the boundaries of the adhesive-applied areas.

It is still another object of the present invention to provide a method for making a patterned metal foil/substrate laminate wherein an adhesive is applied between the metal foil and the substrate in selected areas in a predetermined pattern and the metal foil is cut with a laser beam, without unacceptably cutting or degrading the substrate, in a pattern that corresponds to the boundaries of the adhesive-applied areas.

It is another object of the present invention to provide a method for making a container for packaging food intended to be heated in a microwave oven according to which a patterned metal foil/substrate laminate is formed into a container wherein the foil-containing areas of the laminate form sections of the container which are opaque to microwave energy for preventing overcooking of the food products in those sections of the container and encouraging uniform cooking of the food.

It is still another object of the present invention to provide a patterned metal foil/substrate laminate for microwave packaging and other applications wherein the pattern is formed by laminating a sheet of metal foil to a substrate by applying an adhesive between the foil and substrate in selected areas in a predetermined pattern, cutting the metal foil, for example with a cutting tool such as a rotary die or a laser, in a pattern that corresponds to the boundaries of the adhesive-applied areas and removing the unadhered areas of metal foil to provide a laminate wherein the metal foil pattern corresponds to the adhesive application pattern.

The foregoing and other objects are achieved in accordance with the present invention by providing a method of forming a patterned metal foil/substrate laminate comprising the steps of laminating a sheet of metal foil to a substrate by applying an adhesive between the foil and the substrate in a predetermined pattern which defines areas where adhesive is present and areas where no adhesive is present; cutting the metal foil in a pattern which corresponds to the boundaries of the adhesive-containing areas; and, removing the areas of metal foil which are not adhesively adhered to the substrate. In one embodiment, the method includes the further step of laminating a sheet of barrier layer material, preferably polymer film, to the patterned metal foil layer of the patterned metal foil/substrate laminate. Preferably the metal foil is cut using a rotary die, desirably a machined rotary die, or a laser beam. Advantageously, the metal foil is unannealed aluminum foil, the substrate is paperboard and the polymer film is a polyester film. In another embodiment, the present invention provides a patterned metal foil/substrate laminate wherein the pattern is formed by laminating a sheet of metal foil to a substrate by applying an adhesive between the metal foil and substrate in selected areas in a predetermined pattern, cutting the metal foil in a pattern that corresponds to the boundaries of the adhesive-applied areas and removing the unadhered areas of metal foil, whereby the metal foil pattern corresponds to the adhesive application pattern. In yet another embodiment, the present invention provides a container for packaging food intended to be heated in a microwave oven and a method for making such a container according to which a patterned metal foil/substrate laminate is formed into a container wherein the foil-containing areas of the laminate form sections of the container which are opaque to microwave energy for preventing overcooking of foods in those sections of the container.

BRIEF DESCRIPTION OF THE DRAWINGS

FIG. 1 is a diagrammatic representation of a laminate including a patterned metal foil formed in accordance with the present invention.

FIG. 2 is a schematic representation of a first method of making patterned metal foil laminates in accordance with the present invention.

DESCRIPTION OF THE PREFERRED EMBODIMENT

Figure 3:
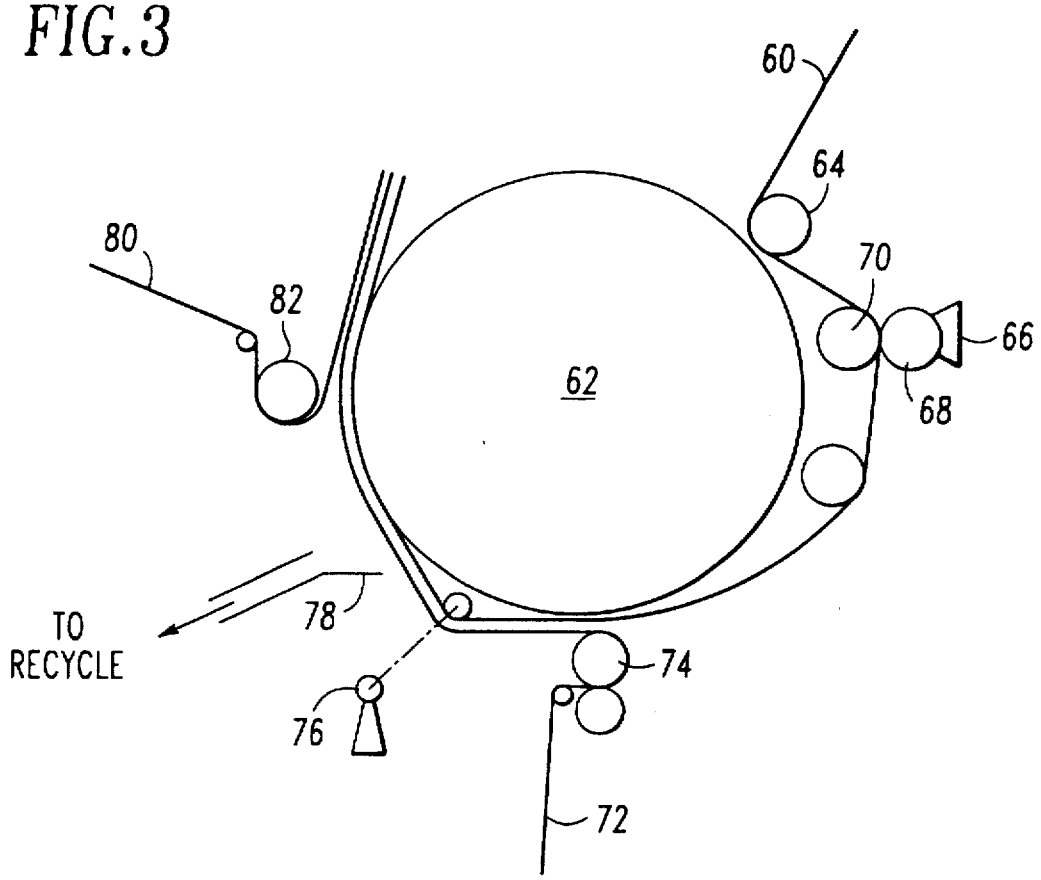
FIG. 3 is a schematic representation of a second method of making patterned metal foil laminates in accordance with the present invention.

Most commercially available packaging for food products intended to be cooked by microwave energy has the overall configuration of a three dimensional rectangular solid, the food product being contained within the walls. This configuration is easily formed from flat two dimensional blanks made of paperboard and the like, which can be folded or pressed to produce a three dimensional container of the desired size. Where the food product has a relatively large volume or pronounced thicker or thinner areas, the likely result of microwave cooking is that the edges and/or the thinner areas will be overcooked while the center and thicker areas will remain frozen or be barely cooked. To eliminate or at least reduce this undesirable effect, the blanks may include portions formed of a substrate/metal foil laminate to define microwave transparent areas and microwave opaque areas of the packaging which can be positioned proximate to selected foods or portions of foods within the container to selectively shield these foods from microwave energy.

The present invention provides a metal foil/substrate laminate which is particularly useful for packaging foods intended for microwave heating and an advantageous and economical method of making such laminates. In accordance with the present invention, predetermined selected areas of the metal foil are removed, rendering those portions of the laminate transparent to microwave energy while the areas of the laminate where the metal foil is present remain opaque to microwave energy. By customizing the metal foil patterning to the heating requirements of the food product, a container can be formed from the laminate wherein the foil-containing areas of the laminate form sections of the container which are opaque to microwave energy for preventing overcooking of the food products in those sections of the container and encouraging uniform cooking of the food products. The metal foil patterns may be easily and conveniently customized to the food product and so shaped that undesirable heating areas in the food packaging are avoided. Moreover, the microwave energy heating activity may be selectively reduced in different portions of the container to heat various portions of a food product at different rates or to different degrees.

FIG. 1 illustrates a patterned metal foil/substrate laminate 10 having areas which contain metal foil and areas from which the metal foil has been removed which was made in accordance with the method of the present invention. The relative sizes of the layers shown are exaggerated for purposes of illustration. Laminate 10 includes a substrate 12, which may also function as one of the walls of the container comprising the food packaging. A metal foil layer 14 is adhered to substrate 12 and preferably positioned between the substrate and a barrier layer, such as a polymer film, 16 to which it is bonded. As will become apparent from the description which follows, laminate 10 is formed by applying adhesive in a predetermined pattern onto a substrate 12, adhering a metal foil sheet 14 to the substrate 12, cutting the metal foil sheet 14 in a pattern corresponding to the pattern of the applied adhesive, removing the unadhered metal foil and, for some applications, laminating a polymer film 16 over the adhered metal foil 14 into contact with the substrate and the foil. Metal foil layer 14, shown in FIG. 1, represents the portion of the applied metal foil sheet which remains following cutting and removing the unadhered portions thereof.

The barrier layer 16 is preferably a heat tolerant and stable material which functions as a barrier to separate a food product in the container from the metal foil layer. The layer 16 must be microwave energy transparent and sufficiently stable at high temperatures when laminated to the metal foil so that it is suitable for contact with food at the temperatures reached while the food is being cooked in a microwave oven. Layer 16 may be formed from a wide variety of stable materials having barrier properties, such as polymeric film and paper, including polyesters, polyolefins, nylon, cellophane, paper and polysulfones. Polyester is the film material preferred for food containers because of its heat stability and surface smoothness. The thickness of the plastic film can preferably be about 0.0003 to 0.002 inches and, most desirably, about 0.0005 inches.

The metal foil 14 is preferably aluminum foil, but may be any well known, thin, laminatable, microwave opaque metal foil, such as an aluminum alloy foil. In a preferred embodiment of the invention the foil is a less malleable, i.e., more brittle, annealed or unannealed foil. An example of such an annealed foil is a relatively brittle aluminum alloy which is designed for diecutting. Such a foil is commercially available as Alumax 8145. However, particularly preferred for use is unannealed aluminum foil. Desirably, the foil utilized in the laminate of the present invention has a thickness in the range of 0.0002 to 0.002 inches and, more preferably, is relatively thin having a thickness in the range of 0.0002 to 0.0006 inches. The substrate 12 is preferably a flexible material which is transparent to microwave energy and which has a relatively high insulating capacity and a heat stability sufficient to withstand cooking temperatures in a microwave oven. Suitable substrate materials include paper, coated and uncoated paperboard, plastic films such as polyester films, and composite materials, such as fiber/polymer composites. For microwave applications, the preferred substrate materials are paper, coated and uncoated paperboard and polymer films.

The patterned metal foil/substrate laminate 10 is advantageously made in accordance with the present invention in accordance with the method which is schematically illustrated in FIG. 2 wherein adhesive is applied to the substrate-foil interface only in those areas of the laminate where microwave reflection is desired. Next, the foil is cut, without significantly defacing, cutting or otherwise damaging the substrate, in a pattern that corresponds to the boundaries of the adhesive applied areas. The areas of the foil which are not adhesively adhered to the substrate are removed and, desirably, sent to a clean recycle stream. As a final step, particularly for microwave food packaging applications, a barrier layer, such as a polymer film layer, may be applied over the patterned metal foil layer to act as a barrier between the metal foil/substrate laminate and the food product. The resulting laminate, comprising a substrate with patterned microwave reflecting foil areas adhesively laminated thereto, is particularly useful to form blanks for pressed or folded microwave trays and cartons.

Referring to FIG. 2, a sheet of substrate material 30, for example, paperboard, is fed around feed roll 32. Adhesive is distributed from an adhesive reservoir 34 onto a patterned gravure roll 36 which transfers the adhesive in the predetermined pattern of the roll onto a sheet of metal foil 38 as the foil passes over laminating roll 40 into laminating contact with substrate sheet 30. Alternatively, adhesive may be applied using a flexographic rubber roll which has a raised pattern formed thereon. The resulting metal foil/substrate laminate passes between a rotary die 42 and anvil 44 where the metal foil layer is cut in a pattern that corresponds to the boundaries of the adhesive-applied areas without significantly defacing or degrading the substrate. Metal foil which is not adhesively adhered to the substrate is vacuum stripped in vacuum trim collection station 46 and sent to a clean metal foil recycle station (not shown). The trim collection station, in one embodiment, comprises a combination rotating vacuum/pressure drum/vacuum hood or, simply, a vacuum hood, to remove the foil trim and scraps and blow the trim and scraps to a recycle station. Thereafter, a barrier layer, such as a thin polymer film layer, e.g., a polyester film, may be applied over the patterned metal foil. Various techniques may be used to coat or laminate the polymer film 48 onto the metal foil. For example, a polymer film having a heat sealable layer, such as amorphous polyester, on the surface thereof intended to contact the metal foil layer can be laminated to the foil layer by hot nip lamination. According to this technique, polymer film 48 passes over heated film laminating roll 50 to melt the heat sealable layer such that, when the melted layer is pressed into contact with the metal foil layer, the polymer film is heat sealed to the metal foil and substrate (in areas where the metal foil has been removed). Other well known laminating or coating techniques, such as dry mount adhesive lamination, extrusion lamination, lamination using a solventless adhesive and extrusion coating, can likewise be utilized in the method of the present invention.

Foil kiss rotary diecutting is one preferred method for cutting the foil in a pattern corresponding to the pattern of the applied adhesive. A problem encountered in diecutting aluminum foil/paperboard substrates is that aluminum foil is very malleable. It undergoes large out-of-plane shear strains without failing. In order to part the foil, a die has to penetrate deeply into the thick, soft board substrate. In the process, depending upon the die, the board may be unacceptably cut and damaged. In accordance with the present invention it has been found that machined rotary dies are the preferred cutting tool for diecutting aluminum foil. More particularly, machined rotary dies are typically sharp, even, precisely machined solid steel parts. Machined rotary dies are especially effective diecutting tools in that they are capable of clean, sharp, precise metal foil cutting without also cutting the underlying substrate. Rotary steel rule dies also produce satisfactory results in many applications. Serrated steel rule dies appear to produce superior results to straight steel rule dies. In addition, cutting is enhanced with steel rule dies when the substrate is corrugated paperboard, such as f-flute corrugated board, or when soft anvils are used during the diecutting. The soft anvil may be a conventional soft anvil, corrugated paperboard or the paperboard substrate which has been moisturized to provide the soft anvil.

Still better results are obtained where the metal foil is an unannealed aluminum foil. It is believed that the improved results observed with unannealed foils stems from the fact that such foils are more brittle and easier to die cut. For example, in one instance, particularly good results were obtained using a 0.0003 inch thick unannealed aluminum foil, commercially available as Alumax 1145 H19, laminated to a coated 18 pt. paperboard. No significant difference is noted when uncoated paperboard is substituted. When using unannealed metal foils, care should be exercised that lubricants used in the rolling of aluminum foil do not interfere with bonding the metal foil to the substrate. Unannealed foils still carry lubricating surface layers and these can interfere with bonding. Accordingly, surface lubricants on unannealed metal foil may be treated, e.g. by corona treatment or mild flame treatment sufficient to remove surface lubricants but insufficient to anneal the foil, to increase adhesion. Alternatively, special adhesives can be employed which form an effective bond even when the surface lubricants are present.

It will be appreciated that the laminating method described hereinabove can be practiced on various types of laminating equipment and all such equipment having the capability of performing the method of the present invention is contemplated for use in connection with the present invention. One suitable item of laminating equipment is a flexographic press with individual decks on which the various method steps can be performed. Another suitable item of laminating equipment utilizes a central impression drum, such as is shown schematically in FIG. 3.

The method which is schematically illustrated in FIG. 3 is substantially identical to the method schematically illustrated in FIG. 2 except that the pattern adhesive is applied to the substrate, rather than to the metal foil, prior to laminating the metal foil to the substrate and the metal foil is cut by a laser beam rather than by a rotary die. In the practice of the present invention, it is immaterial whether the adhesive is applied to the metal foil or the substrate. Specifically, with reference to FIG. 3, a sheet of substrate material 60 is fed between a central impression drum 62 and a feed roll 64. Adhesive is distributed from an adhesive reservoir 66 onto a patterned gravure roll 68 which transfers the adhesive in the predetermined pattern of the roll onto one face of the substrate sheet as it passes between support roll 70 and gravure roll 68. Alternatively, adhesive may be applied using a flexographic rubber roll which has the predetermined pattern formed thereon. A sheet of metal foil 72 is brought into laminating contact with the adhesive patterned substrate sheet as the metal foil sheet passes over laminating roll 74. The resulting metal foil/substrate laminate is moved past a laser cutting station 76 in which the metal foil is cut in a pattern that corresponds to the boundaries of the adhesive-applied areas without significantly defacing or degrading the substrate. It has been found that laser beam pattern cutting of metal foil is very precise and highly desirable, particularly where laser beam cutting is accomplished using a Nd:YAG laser. The laser can readily be adjusted for different patterns and different thickness metal foils merely by adjusting laser beam scan pattern and/or changing software. Laser beam cutting effectively burns away the metal foil while carefully preserving the substrate. In many applications, the advantages of laser beam cutting offset the cost disadvantage and the inconvenience that, for large patterns, laser beam cutting is slower than die cutting and the laminate production line must be slowed. Following cutting, foil which is not adhesively adhered to the substrate is vacuum stripped in vacuum trim collection station 78 and sent to a clean metal foil recycle station (not shown). Thereafter, a barrier layer, such as a thin polymer film layer, e.g., a polyester film, may be applied over the patterned metal foil. Various techniques may be used to coat or laminate the polymer film 80 onto the metal foil. For example, a polymer film having a heat sealable layer, e.g., an amorphous polyester layer, on the surface thereof intended to contact the metal foil can be passed over heated film laminating roll 82 to melt the heat sealable layer and pressed into contact with the metal foil to heat seal the polymer film to the metal foil and substrate by hot nip lamination. Alternatively, laminating or coating techniques such as dry mount adhesive lamination, extrusion lamination, lamination using a solventless adhesive and extrusion coating can be utilized.

The goal sought to be achieved by the method of the present invention, whatever materials and/or equipment may be selected, is the production of a laminate, like laminate 10 in FIG. 1, including a patterned metal foil 14 that will reflect microwave energy to prevent overcooking of the food in the container adjacent to the areas where the foil is present. In this manner, selected areas of reduced microwave heating activity, i.e., microwave reflective areas, can be positioned as required in a food package so that different areas of a food product can be heated at different rates and to different degrees.

Figure 4:
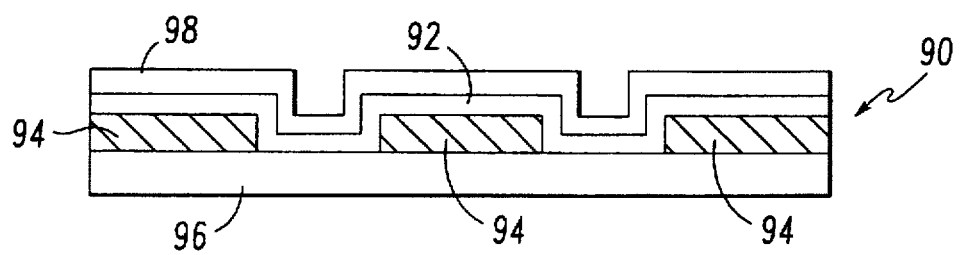
FIG. 4 is a diagrammatic representation of a laminate including a patterned metal foil formed in accordance with the present invention.

In another embodiment of the invention, the barrier layer polymer film can be metallized with a thin metal foil by conventional techniques, such as vacuum metallizing, prior to laminating the polymer film to the patterned metal foil layer. As can be seen in FIG. 4, laminate 90 includes metallized layer 92 positioned between the patterned metal foil layer 94/substrate 96 (in areas where the metal foil has been removed) and one surface of the barrier layer polymer film 98 and adhesively adhered to the patterned metal foil layer 94/substrate 96. The relative sizes of the layers shown are exaggerated for purposes of illustration. As is well known, metallized films having a surface conductivity of about 0.01 Mhos, on a microwave transparent substrate such as a polymer film, will absorb some of the microwave energy and convert it to thermal heating energy which can be used for browning and crisping food products adjacent to the metallized layer. Laminate 90 has substantially all of the attributes of laminate 10 in enhancing uniform microwave cooking of food products by selectively shielding portions of the food products. In addition, however, in those areas of the laminate 90 where the patterned metal foil layer 94 has been removed, laminate 90 has the attributes of a microwave interactive layer. It will be appreciated that, when laminate 90 is formed into a food package for microwave cooking, appropriate selection of a metal foil pattern and selective positioning of the patterned metal foil permits not only selective shielding but also selective browning and crisping of the food product within the food package.

Figure 5:
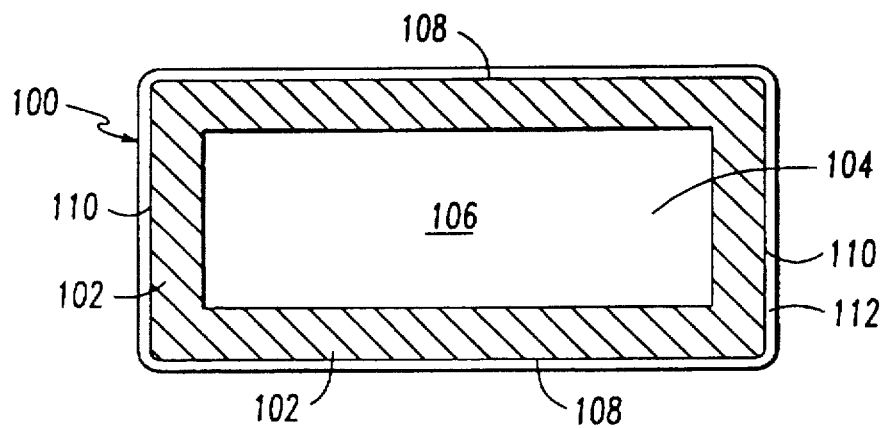
FIG. 5 is a plan view of a blank for a container for packaging food intended for heating in a microwave oven, including one illustrative embodiment of patterned microwave packaging in accordance with the present invention.

The representation of one embodiment of a patterned metal foil/substrate laminate in accordance with the present invention for packaging foods intended for microwave heating is shown in the tray blank 100 of FIG. 5. Tray blank 100 will ultimately be press formed to form a microwave heating container. The configuration of microwave reflective areas 102 and microwave transmissive areas 104 in the blank 100 is illustrative of an effective configuration for food products of a particular size, shape and dielectric constant. As can be seen, the portion of tray blank 100 which will form the bottom 106 when the blank 100 is press formed to form a tray contains no foil-containing areas. By contrast, the portion of tray blank 100 which will form the side panels 108, 110 when the blank 100 is press formed to form a tray comprise substantially entirely foil-containing areas. Peripheral tray lip 112 is entirely free of metal foil to assure that there is no arcing to the microwave oven walls. The patterning of the metal foil and the resulting selective positioning of the foil containing areas 102 avoids excessive microwave heating of the food product in these areas and encourages uniform cooking.

Figure 6:
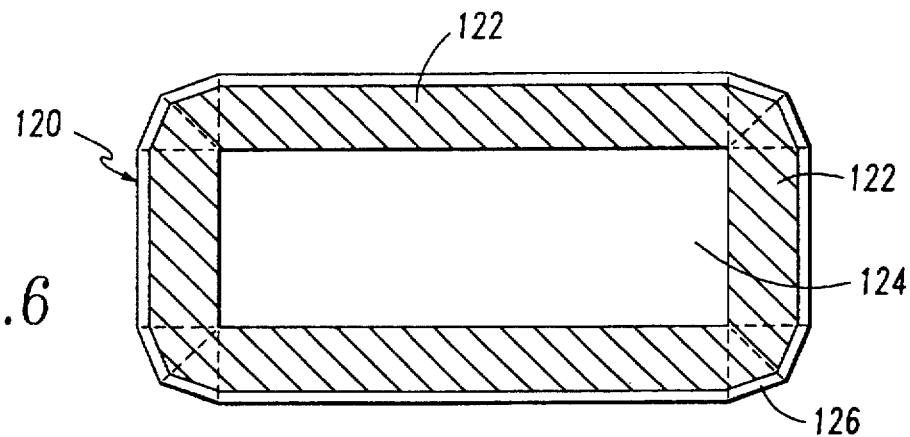
FIG. 6 is a plan view of another blank for a container for packaging food intended for heating in a microwave oven, including a second illustrative embodiment of patterned microwave packaging in accordance with the present invention.

FIG. 6 is an example of another tray blank 120 formed from the patterned metal foil/substrate laminate of the present invention. Tray blank 120 will ultimately be folded to form a microwave heating container. As with tray blank 100, blank 120 includes foil-containing areas 122, which will reflect microwave energy, and areas 124 where the foil has been removed in accordance with the method of the present invention, which will transmit microwave energy. Again, the peripheral tray lip 126 is entirely free of metal foil to assure that there is no arcing to the microwave oven walls. The resulting patterning and selective positioning of the foil containing areas 122 encourages uniform cooking of the food product.

Figure 7:
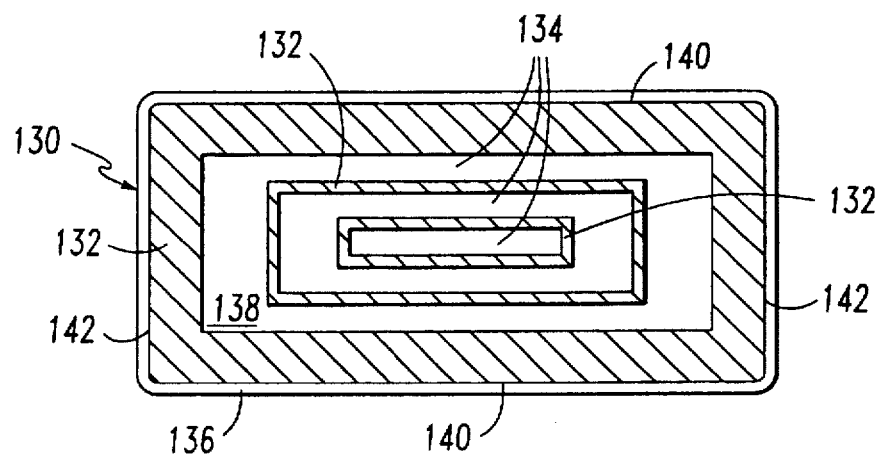
FIG. 7 is a plan view of still another blank for a container for packaging food intended for heating in a microwave oven, including a third illustrative embodiment of patterned microwave packaging in accordance with the present invention.

FIG. 7 is yet another example of a tray blank 130 formed from the patterned metal foil/substrate laminate of the present invention. Tray blank 130 will ultimately be press formed to form a microwave heating container. As with tray blanks 100 and 120, blank 130 includes foil-containing areas 132, which will reflect microwave energy, and areas 134 where the foil has been removed in accordance with the method of the present invention, which will transmit microwave energy. Again, the peripheral tray lip 136 is entirely free of metal foil to assure that there is no arcing to the microwave oven walls. The foil containing areas on what will form the bottom 138 when the blank 130 is press formed to form a tray include spaced, generally concentric rings. The portion of tray blank 130 which will form the side panels 140, 142 when the blank 130 is press formed comprise substantially entirely foil-containing areas. The resulting patterning and selective positioning of the foil containing areas 132 avoids overcooking of the food product in the foil-containing areas and encourages uniform cooking of the food product.

The types of patterns that may be employed for this purpose are essentially unlimited and may be varied as desired according to the microwave heating requirements of a particular food product. Ideally, to insure uniform cooking, each type of food product should be packaged in a container having a pattern of metal foil containing areas specifically designed for that type of food product. The present invention achieves this objective and facilitates the provision of patterned metal foil/substrate laminates specifically designed to produce the desired uniform cooking of a particular food product when that food product is heated in a microwave oven.

INDUSTRIAL APPLICABILITY

The patterned metal foil/substrate laminates of the present invention are primarily useful in the production of packaging for food products intended for heating in a microwave oven for assuring the uniform cooking of the food product. However, these laminates have non-microwave cooking applications as well, such as in electronic article surveillance applications or other applications in which laminates having customizable metal foil patterning is desired.

We claim:

1. A method of forming a patterned metal foil/substrate laminate comprising the steps of:
   (a) laminating a sheet of metal foil to a substrate by applying an adhesive between said metal foil and said substrate in a pattern which defines areas where adhesive is present and areas where no adhesive is present;
   (b) cutting said metal foil in a pattern which corresponds to the boundaries of the adhesive-containing areas; and
   (c) removing the areas of metal foil which are not adhesively adhered to said substrate.

2. A method as claimed in claim 1 including the further step of laminating a sheet of barrier layer material to the patterned metal foil layer of said laminate.

3. A method as claimed in claim 2 wherein said barrier layer material is a polymer film.

4. A method as claimed in claim 3 wherein the polymer film is a polyester film.

5. A method as claimed in claims 3 or 4 wherein said polymer film is metallized on one surface thereof and said metallized surface is adhesively adhered to said patterned metal foil layer.

6. A method as claimed in claim 2 wherein said sheet of barrier layer material is laminated to the patterned metal foil layer of said laminate by hot nip lamination.

7. A method as claimed in claim 2 wherein said sheet of barrier layer material is laminated to the patterned metal foil layer of said laminate by extrusion lamination.

8. A method as claimed in claim 2 wherein said sheet of barrier layer material is laminated to the patterned metal foil layer of said laminate by applying a layer of solventless adhesive to said film prior to lamination.

9. A method as claimed in claim 2 wherein said sheet of barrier layer material is laminated to the patterned metal foil layer of said laminate by dry mount adhesive lamination.

10. A method as claimed in claim 2 wherein said sheet of barrier layer material is extrusion coated onto the patterned metal layer of said laminate.

11. A method as claimed in claims 1 or 2 wherein the step of cutting comprises rotary die cutting.

12. A method as claimed in claim 11 wherein said step of rotary die cutting is accomplished using a machined rotary die.

13. A method as claimed in claim 11 wherein said step of rotary die cutting is accomplished using a rotary steel rule die.

14. A method as claimed in claim 13 wherein said die acts against a soft anvil.

15. A method as claimed in claim 14 wherein said soft anvil is corrugated paperboard.

16. A method as claimed in claim 14 wherein said soft anvil is moisturized paperboard.

17. A method as claimed in claims 1 or 2 wherein the step of cutting comprises laser beam cutting.

18. A method as claimed in claim 17 wherein said step of laser beam cutting is accomplished using a Nd:YAG laser.

19. A method as claimed in claims 1 or 2 wherein said substrate is selected from the group consisting of paper, coated paperboard, uncoated paperboard and polymer film.

20. A method as claimed in claim 19 wherein said polymer film is a polyester film.

21. A method as claimed in claim 1 wherein said substrate is a polymer film and including the further step of adhesively laminating a sheet of paperboard to the patterned metal foil layer of the laminate.

22. A method as claimed in claim 19 wherein said metal foil is aluminum foil.

23. A method as claimed in claim 22 wherein said metal foil is unannealed aluminum foil.

24. A method as claimed in claim 23 including the step of corona treating the surface of said unannealed aluminum foil prior to laminating said aluminum foil to said substrate.

25. A method as claimed in claim 23 including the step of mild flame treating the surface of said unannealed aluminum foil prior to laminating said aluminum foil to said substrate.

26. A method as claimed in claim 22 wherein said metal foil is a diecutting aluminum alloy foil.

27. A method as claimed in claim 1 wherein said areas of unadhered metal foil are removed by vacuum stripping.

28. A method of forming a container for packaging food intended for heating in a microwave oven, the container having at least one section that is opaque to microwave energy for shielding food adjacent to the opaque section, and at least one section that is substantially transparent to microwave energy, said method comprising the steps of:

(a) laminating a sheet of metal foil to a substrate by applying an adhesive between said metal foil and said substrate in a pattern which defines areas where adhesive is present and areas where no adhesive is present;

(b) cutting said metal foil in a pattern which corresponds to the boundaries of the adhesive-containing areas;

(c) removing the areas of metal foil which are not adhesively adhered to said substrate;

(d) laminating a sheet of barrier layer material to the patterned metal foil layer; and (e) forming said barrier layer/patterned metal foil/ substrate laminate into said container with said barrier layer adjacent to the food in the container, the areas of the laminate from which metal foil was removed forming the sections of the container that are transparent to microwave energy and the foil-containing areas of the laminate forming the sections of the container that are opaque to microwave radiation.

29. A method as claimed in claim 28 wherein said metal foil is aluminum foil, said substrate is selected from the group consisting of paper, coated paperboard, uncoated paperboard and polymer film and said barrier layer material is polymer film.

30. A method as claimed in claim 29 wherein said metal foil is unannealed aluminum foil.

31. A method as claimed in claim 30 including the step of corona treating the surface of said unannealed aluminum foil prior to laminating said aluminum foil to said substrate.

32. A method as claimed in claim 30 including the step of mild flame treating the surface of said unannealed aluminum foil prior to laminating said aluminum foil to said substrate.

33. A method as claimed in claim 28 wherein said step of cutting comprises rotary die cutting with a machined rotary die.

34. A method as claimed in claim 28 wherein said step of cutting comprises laser beam cutting.

35. A method as claimed in claim 28 wherein said barrier layer material is polymer film, said polymer film is metallized on one surface thereof and said metallized surface is adhesively adhered to said patterned metal foil layer.

36. A method as claimed in claim 28 wherein said areas of unadhered metal foil are removed by vacuum stripping.

37. A patterned metal foil/substrate laminate wherein said pattern is formed by laminating a sheet of metal foil to a substrate by applying an adhesive between said metal foil and said substrate in a pattern which defines areas where adhesive is present and areas where no adhesive is present, cutting said metal foil in a pattern which corresponds to the boundaries of the adhesive-containing areas and removing the areas of metal foil which are not adhesively adhered to said substrate.

38. A patterned metal foil/substrate laminate as claimed in claim 37 further including a sheet of barrier layer material laminated to the patterned metal foil layer.

39. A patterned metal foil/substrate laminate as claimed in claim 38 wherein said barrier layer material is polymer film.

40. A patterned metal foil/substrate laminate as claimed in claims 37, 38 or 39 wherein said metal foil is aluminum foil and said substrate is selected from the group consisting of paper, coated paperboard, uncoated paperboard and polymer film.

41. A patterned metal foil/substrate laminate as claimed in claim 40 wherein said metal foil is unannealed aluminum foil.

42. A patterned metal foil/substrate laminate as claimed in claim 39 wherein said polymer film is metallized on one surface thereof and said metallized surface is adhesively adhered to said patterned metal foil layer.

43. A container for packaging food intended for heating in a microwave oven, said container having at least one section that is opaque to microwave energy for shielding food adjacent to the opaque section, and at least one section that is substantially transparent to microwave energy, said container formed from a barrier layer/patterned metal foil/ substrate laminate with said barrier layer adjacent to the food in the container, wherein said barrier layer/patterned metal foil/substrate laminate is formed by laminating a sheet of metal foil to a substrate by applying an adhesive between said metal foil and said substrate in a pattern which defines areas where adhesive is present and areas where no adhesive is present, cutting said metal foil in a pattern which corresponds to the boundaries of the adhesive-containing areas, removing the areas of metal foil which are not adhesively adhered to said substrate and laminating a sheet of barrier layer material to the patterned metal foil layer, whereby the areas of the laminate from which metal foil was removed form the sections of the container that are transparent to microwave energy and the foil-containing areas of the laminate form the sections of the container that are opaque to microwave radiation.

44. A container as claimed in claim 43 wherein said metal foil is aluminum foil, said substrate is selected from the group consisting of paper, coated paperboard, uncoated paperboard and polymer film and said barrier layer material is polymer film.

45. A container as claimed in claim 44 wherein said metal foil is unannealed aluminum foil.

46. A container as claimed in claim 43 wherein said barrier layer material is polymer film, said polymer film is metallized on one surface thereof and said metallized surface is adhesively adhered to said patterned metal foil layer.

* * * * *